United States Patent
Ikeda et al.

(10) Patent No.: US 12,051,564 B2
(45) Date of Patent: Jul. 30, 2024

(54) SHOWER PLATE, PLASMA PROCESSING APPARATUS AND PLASMA PROCESSING METHOD

(71) Applicants: Tokyo Electron Limited, Tokyo (JP); TOHOKU UNIVERSITY, Miyagi (JP)

(72) Inventors: Taro Ikeda, Nirasaki (JP); Satoru Kawakami, Nirasaki (JP); Masaki Hirayama, Tokyo (JP)

(73) Assignees: TOKYO ELECTRON LIMITED, Tokyo (JP); TOHOKU UNIVERSITY, Miyagi (JP)

( * ) Notice: Subject to any disclaimer, the term of this patent is extended or adjusted under 35 U.S.C. 154(b) by 476 days.

(21) Appl. No.: 17/299,958

(22) PCT Filed: Nov. 26, 2019

(86) PCT No.: PCT/JP2019/046214
§ 371 (c)(1),
(2) Date: Jun. 4, 2021

(87) PCT Pub. No.: WO2020/116246
PCT Pub. Date: Jun. 11, 2020

(65) Prior Publication Data
US 2022/0037117 A1 Feb. 3, 2022

(30) Foreign Application Priority Data
Dec. 6, 2018 (JP) .................................. 2018-229223

(51) Int. Cl.
*H01J 37/32* (2006.01)

(52) U.S. Cl.
CPC .... *H01J 37/32091* (2013.01); *H01J 37/3244* (2013.01); *H01J 37/32541* (2013.01);
(Continued)

(58) Field of Classification Search
CPC ............. H01J 37/32091; H01J 37/3244; H01J 37/32541; H01J 37/32568;
(Continued)

(56) References Cited

U.S. PATENT DOCUMENTS 5,439,524 A * 8/1995 Cain ................. H01J 37/32449
156/345.47
7,829,815 B2 * 11/2010 Chen ..................... H01J 37/321
219/121.48
(Continued)

FOREIGN PATENT DOCUMENTS

JP 9-312268 A 12/1997
JP 2000269146 A * 9/2000 ....... C23C 16/45565
(Continued)

*Primary Examiner* — Jeffrie R Lund
(74) *Attorney, Agent, or Firm* — Nath, Goldberg & Meyer; Jerald L. Meyer; Tanya E. Harkins

(57) ABSTRACT

In a shower plate, a plasma processing apparatus, and a plasma processing method, improvement of in-plane uniformity of plasma on a stage is required. The shower plate according to an exemplary embodiment includes an upper dielectric disposed to face a stage and an upper electrode embedded in the upper dielectric. A distance between a bottom surface of the upper dielectric and the upper electrode is shorter in a peripheral portion than in a central portion.

12 Claims, 7 Drawing Sheets

(52) U.S. Cl.
CPC .. *H01J 37/32568* (2013.01); *H01J 37/32715* (2013.01); *H01J 2237/2007* (2013.01)

(58) Field of Classification Search
CPC ......... H01J 37/32715; H01J 2237/2007; H01J 37/32174; C23C 16/44; H01L 21/3065; H01L 21/31; H01L 21/683; H05H 1/46
See application file for complete search history.

(56) References Cited

U.S. PATENT DOCUMENTS

| | | | | |
|---|---|---|---|---|
| 8,529,730 | B2 * | 9/2013 | Yamazawa | H01J 37/32165 156/345.43 |
| 2002/0094591 | A1 * | 7/2002 | Sill | H01J 37/321 438/714 |
| 2008/0102209 | A1 * | 5/2008 | Sasaki | H01L 21/67288 118/712 |
| 2009/0155489 | A1 * | 6/2009 | Schmitt | H01J 37/32541 118/723 R |
| 2011/0155322 | A1 * | 6/2011 | Himori | H01J 37/32091 156/345.44 |
| 2012/0168083 | A1 * | 7/2012 | Yamazawa | H01J 37/32082 156/345.44 |
| 2012/0206033 | A1 * | 8/2012 | Matsuyama | H01J 37/32623 313/355 |
| 2022/0037117 | A1 * | 2/2022 | Ikeda | C23C 16/44 |

FOREIGN PATENT DOCUMENTS

| | | | |
|---|---|---|---|
| JP | 2000-323456 | A | 11/2000 |
| JP | 2002-50618 | A | 2/2002 |
| JP | 4364667 | B2 | 8/2009 |
| JP | 2012-186457 | A | 9/2012 |
| JP | 5317992 | B2 | 7/2013 |
| JP | 5367000 | B2 | 9/2013 |
| JP | 2014-53309 | A | 3/2014 |
| JP | 5513104 | B2 | 4/2014 |
| JP | 2016-195150 | A | 11/2016 |
| KR | 20080061807 | A * | 7/2008 |
| KR | 1020110076815 | A | 7/2011 |

* cited by examiner

SHOWER PLATE, PLASMA PROCESSING APPARATUS AND PLASMA PROCESSING METHOD

This is a National Phase Application filed under 35 U.S.C. 371 as a national stage of PCT/JP2019/046214, filed Nov. 26, 2019, an application claiming the benefit of Japanese Application No. 2018-229223, filed Dec. 6, 2018, the content of each of which is hereby incorporated by reference in its entirety.

TECHNICAL FIELD

Exemplary embodiments of the present disclosure relate to a shower plate, a plasma processing apparatus, and a plasma processing method.

BACKGROUND

In manufacturing of electronic devices, a plasma processing apparatus is used. A type of plasma processing apparatus is described in Patent Document 1. Other plasma processing apparatuses are described in Patent Documents 2 to 8. As the plasma processing apparatus, a capacitively coupled plasma processing apparatus is known. As the capacitively coupled plasma processing apparatus, a plasma processing apparatus that generates plasma by using radio frequency waves having a frequency of the very high frequency (VHF) band is attracting attention. The VHF band is a frequency band in a range of about 30 MHz to 300 MHz.

PRIOR ART DOCUMENTS

Patent Documents

Patent Document 1: Japanese Laid-Open Patent Publication No. 2016-195150
Patent Document 2: Japanese Laid-Open Patent Publication No. H9-312268
Patent Document 3: Japanese Laid-Open Patent Publication No. 2014-53309
Patent Document 4: Japanese Laid-Open Patent Publication No. 2000-323456
Patent Document 5: Japanese Patent No. 4364667
Patent Document 6: Japanese Patent No. 5317992
Patent Document 7: Japanese Patent No. 5367000
Patent Document 8: Japanese Patent No. 5513104

SUMMARY

In a shower plate, a plasma processing apparatus, and a plasma processing method, improvement of in-plane uniformity of plasma on a stage is required.

An exemplary embodiment provides a shower plate. The shower plate includes an upper dielectric disposed to face a stage, and an upper electrode embedded in the upper dielectric. A distance between a bottom surface of the upper dielectric and an upper electrode is shorter in a peripheral portion of the shower plate than in a central portion of the shower plate.

With a shower plate, a plasma processing apparatus, and a plasma processing method according to the exemplary embodiment, it is possible to improve in-plane uniformity of plasma on a stage.

DETAILED DESCRIPTION

Figure 1:
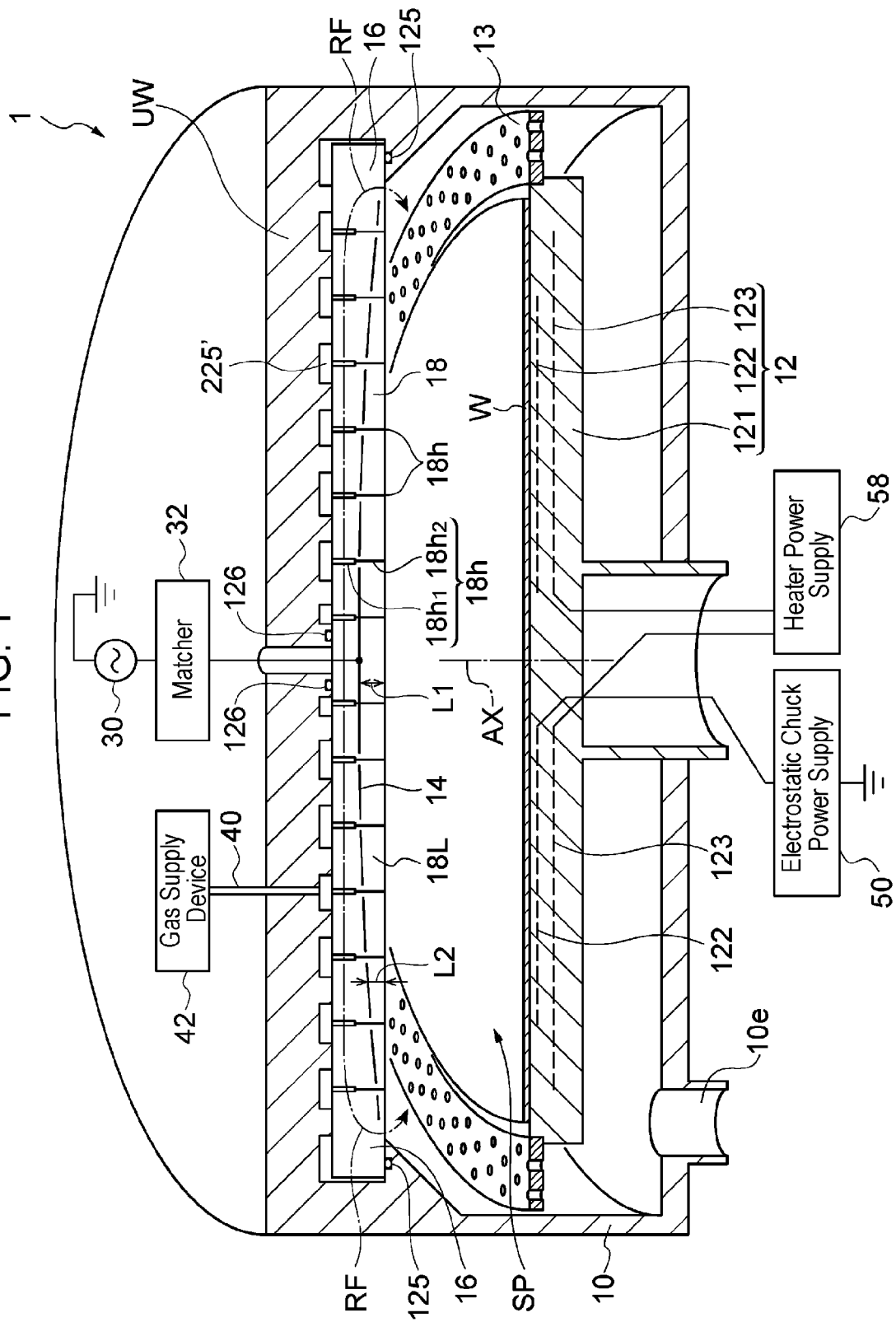
FIG. 1 is a view schematically illustrating a plasma processing apparatus according to an exemplary embodiment.

Hereinafter, various exemplary embodiments will be described.

In an exemplary embodiment, a shower plate is provided. The shower plate includes an upper dielectric disposed so as to face a stage and an upper electrode embedded in the upper dielectric. A distance between the bottom surface of the upper dielectric and the upper electrode is shorter in a peripheral portion of the shower plate than in a central portion of the shower plate. A sheath electric field that generates plasma tends to be strong in a central portion of the stage, and an electric field vector tends to be inclined and weakened in a peripheral portion of the stage. In the peripheral portion, the distance between the upper electrode and the bottom surface of the upper dielectric is smaller than that in the central portion. By forming an electric field from the upper electrode via the upper dielectric, it is possible to correct the inclination and strength of the electric field vector and to improve the in-plane uniformity of the sheath electric field. This makes it possible to improve the in-plane uniformity of plasma.

In an exemplary embodiment, the upper electrode may have two or more conductive layers.

In an exemplary embodiment, the upper dielectric may have gas ejection holes.

In an exemplary embodiment, a radio frequency voltage having a frequency of 30 to 300 MHz is applied to the upper electrode.

An exemplary embodiment provides a plasma processing apparatus including the shower plate. In the plasma processing apparatus, the stage includes a lower dielectric, a lower electrode, a processing container, and a radio frequency power supply. The lower dielectric is disposed to face the upper dielectric. The lower electrode is embedded in the lower dielectric. The processing container accommodates the shower plate and the stage. The radio frequency power supply is for generating plasma in the processing container. When a radio frequency voltage is applied from the radio frequency power supply, plasma is generated between the stage and the upper electrode.

In an exemplary embodiment, the lower electrode may be an electrode for generating electrostatic attraction between a substrate placed on the stage and the stage. The lower electrode may be an electrode to which radio frequency waves are supplied. The lower electrode may be a grounded electrode. That is, the lower electrode may be any of these electrodes. The lower electrode may be formed in an annular shape. In the case of this configuration, the generation of a potential difference due to radio frequency waves between the central portion and the outer peripheral portion of the stage is suppressed. As a result, a radio frequency electric field generated between the central portion and the outer peripheral portion of the stage is suppressed. By suppressing such a radio frequency electric field, it is possible to enhance the uniformity of plasma, and during film formation or etching, it is possible to suppress undesired movement of ions due to the radio frequency electric field.

In an exemplary embodiment, a plasma processing method using the plasma processing apparatus described above is provided. The plasma processing method includes placing a substrate below the shower plate and generating plasma by applying a radio frequency voltage between the upper electrode and the lower electrode to perform a surface processing of the substrate.

Hereinafter, various exemplary embodiments will be described in detail with reference to the drawings. In each of the drawings, the same or corresponding parts will be denoted by the same reference numerals, and a redundant description thereof is omitted.

FIG. 1 is a view schematically illustrating a plasma processing apparatus according to Example 1. A plasma processing apparatus 1 illustrated in FIG. 1 includes a processing container 10, a stage 12, an upper electrode 14 (a conductive layer), and an introduction part 16. The upper electrode 14 is a metal mesh or a metal thin film. In this example, the upper electrode 14 is a metal mesh, and material thereof is tungsten or molybdenum. However, other conductive materials may be used.

The processing container 10 has a substantially cylindrical shape. The processing container 10 extends in a vertical direction. A central axis of the processing container 10 is an axis AX extending in the vertical direction. The processing container 10 is formed of conductor such as aluminum or an aluminum alloy. A corrosion-resistant film is formed on a surface of the processing container 10. The corrosion-resistant film is formed of ceramic such as aluminum oxide or yttrium oxide. The processing container 10 is grounded.

The stage 12 is provided inside the processing container 10. The stage 12 is configured to support a substrate W placed on a top surface thereof substantially horizontally. The stage 12 has a substantially disk-like shape. A central axis of the stage 12 substantially coincides with the axis AX.

The plasma processing apparatus 1 may further include a baffle member 13. The baffle member 13 extends between the stage 12 and a side wall of the processing container 10. The baffle member 13 is a substantially annular plate member. The baffle member 13 is formed of insulating material such as aluminum oxide. A plurality of through-holes is formed in the baffle member 13. The plurality of through-holes penetrate the baffle member 13 in a thickness direction of a plate thereof. An exhaust port 10e is formed in the processing container 10 below the stage 12. An exhaust device is connected to the exhaust port 10e. The exhaust device includes a pressure control valve and a vacuum pump such as a turbo molecular pump and/or a dry pump.

The upper electrode 14 is provided above the stage 12, with a space SP inside the processing container 10 being interposed therebetween. A central axis of the upper electrode 14 substantially coincides with the axis AX. The plasma processing apparatus 1 is configured to generate plasma in the space SP between the stage 12 and the upper electrode 14.

The plasma processing apparatus 1 further includes a shower plate 18. The shower plate 18 includes the upper electrode 14 embedded therein. The shower plate 18 faces a top surface of the stage 12 across the space SP. The space SP is a space between the shower plate 18 and the stage 12. The shower plate 18 has a substantially disk-like shape. A central axis of the shower plate 18 substantially coincides with the axis AX.

In the plasma processing apparatus 1, an area of an inner wall surface of the processing container 10 extending above the baffle member 13 is substantially equal to a surface area of the shower plate 18 on a side of the space SP. That is, an area of a surface set to ground potential (a ground surface) among surfaces defining the space SP is substantially equal to an area of a surface provided by the shower plate 18 among the surfaces defining the space SP. With this configuration, plasma is generated at a uniform density in a region directly below the shower plate 18 and in a region around the ground surface. As a result, in-plane uniformity of a plasma processing for the substrate W is improved.

In the embodiment, a shower plate 18 form of a dielectric is disposed below an upper wall UW of the processing container 10, with a gas diffusion space 225' being interposed therebetween. Convex portions of a bottom surface of the upper wall UW are in contact with a top surface of the shower plate 18. The bottom surface of the upper wall UW has a concave-and-convex structure, and a gas from a gas supply device 42 flows through the concave portions. A pipe 40 is connected to the gas diffusion space 225' in the concave portions. Gas ejection holes 18h in the shower plate 18 are located below the gas diffusion space 225'. A shape of the concave portions may be circular or ring-shaped, but all the concave portions are in communication with one another such that the gas diffuses in a horizontal direction. The gas ejection holes 18h include first through-holes $18h_1$ located in an upper portion and second through-holes $18h_2$ located in a lower portion. An inner diameter of the first through-holes $18h_1$ is larger than an inner diameter of the second through-holes $18h_2$, and the first and second through-holes are in communication with each other. The gas diffused in the gas diffusion space 225' is introduced into the second through-holes $18h_2$ having the small inner diameter, and a flow velocity at the time of ejection is regulated by this diameter. With this structure, it is possible to adjust the flow velocity of the gas.

A main body (an upper dielectric) of the shower plate 18 is formed of a dielectric formed of ceramics. The mesh-shaped upper electrode 14 is embedded in the upper dielectric. Radio frequency waves are applied to the upper electrode 14 from a radio frequency power supply 30 via a matcher 32. Material of the upper dielectric is ceramics, and the upper electrode 14 is embedded in the ceramics through a sintering process. The radio frequency waves propagate radially between the upper wall UW and the upper electrode 14, and are emitted from the introduction part 16 into the processing container 10.

The material of the upper dielectric constituting the shower plate 18 may include at least one dielectric selected from a group consisting of aluminum nitride (AlN), aluminum oxide ($Al_2O_3$) and yttrium oxide ($Y_2O_3$). In this example, aluminum nitride is used, but other materials may be used as the material of the dielectric. The dielectric constituting the shower plate 18 and the upper electrode 14 are formed of a material having high heat resistance. In addition, since the upper electrode 14 has a thin film shape or a mesh shape, even when a thermal expansion coefficient thereof is different from that of the dielectric, thermal stress at a high temperature is small Since the upper electrode 14 is covered with the dielectric, the upper electrode 14 is not corroded even at a high temperature. Therefore, it is possible to use the shower plate 18 even at a high temperature (e.g., 300 degrees C. to 600 degrees C.). By setting a temperature of the shower plate 18 to be high when performing a plasma processing, it is possible to suppress adhesion of reaction products to a surface of the shower plate 18.

A corrosion-resistant film may be formed on at least a bottom surface among surfaces of the upper dielectric (a dielectric plate) constituting the shower plate 18. The corrosion-resistant film may be an yttrium oxide film, an yttrium oxyfluoride film, an yttrium fluoride film, or a ceramic film containing yttrium oxide, yttrium fluoride, or the like.

At a high plasma excitation frequency in the VHF band, a sheath electric field tends to be stronger toward the center. Therefore, particularly in high-density plasma, a plasma density tends to be higher toward the center. In the configuration of this example, a dielectric 18L is disposed between a sheath immediately below the upper electrode and the upper electrode. A radio frequency voltage applied between plasma and the upper electrode is divided by the dielectric 18L and the sheath. That is, a voltage applied to the sheath decreases as the dielectric 18L becomes thicker. By increasing a thickness of the dielectric 18L toward the center, it is possible to improve in-plane uniformity of the sheath electric field and plasma density.

Suppose that a position in a radial direction from the center of the shower plate 18 is r. Assuming that a distance L is f(r), the distance L=f(r) and the function f(r) is a decreasing function that decreases as the position r increases. As a shape of the function f(r), a continuous function such as a cosine function, a Gaussian function, a quadratic function, and a probability density function of a normal distribution, or a curved shape of a surface of a convex lens may be adopted.

Figure 2:
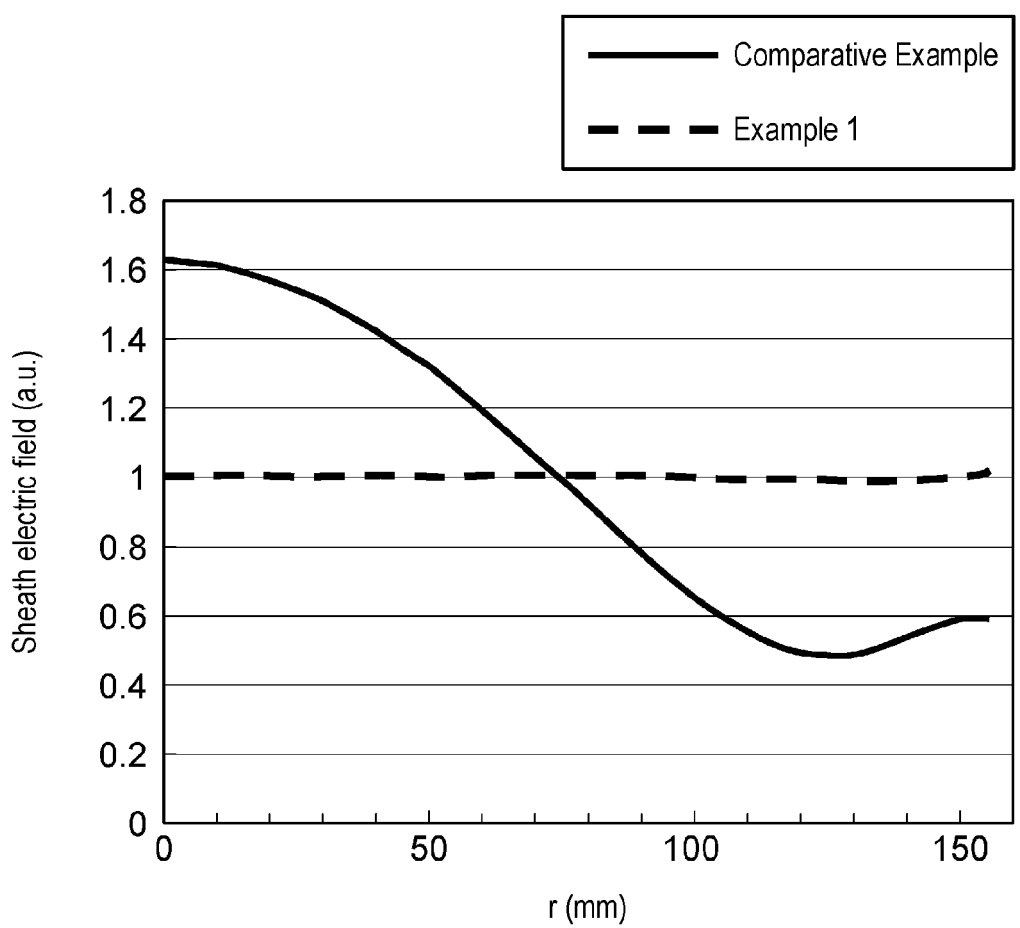
FIG. 2 is a graph showing a relationship between a position in a radial direction and a sheath electric field.

FIG. 2 is a graph showing a relationship between the radial position r (mm) and a sheath electric field (arbitrary unit).

The sheath electric field is an electric field generated in the space SP for plasma generation, and regulates intensity of plasma. In Example 1 above, the sheath electric field is constant and therefore the in-plane uniformity of plasma density is also high.

For reference, FIG. 2 also shows data of a comparative example. The comparative example has a structure in which the upper electrode is formed by replacing the above-mentioned dielectric shower plate with aluminum metal. In the structure of the comparative example, a gap is provided between the metallic upper electrode and a side wall and the upper wall UW of the processing container 10, and this gap is used as a waveguide for VHF. In the comparative example, a path of the waveguide from the inner surface of the side wall of the processing container 10 to the center is set, and VHF waves traveling from the inner surface of the side wall toward the center are introduced into a plasma processing space. Unlike Example 1, in the case of the structure of the comparative example, the sheath electric field changes significantly depending on the position in the radial direction, and the in-plane uniformity of plasma density becomes low. Since the plasma density depends on the sheath electric field, it can be confirmed that the structure of Example 1 is superior to the structure of comparative example from the viewpoint of in-plane uniformity of plasma.

As described above, the plasma processing method using the above-mentioned plasma processing apparatus includes a process of disposing the substrate W under the shower plate 18 and a process of performing a surface processing on the substrate by applying a radio frequency voltage to the upper electrode 14 to generate plasma. The processing is performed while supplying a processing gas into the processing container 10, and depending on a type of the processing gas, etching or film formation may be performed on the substrate W. When using the plasma processing apparatus described above, it is possible to improve the in-plane uniformity of plasma on the stage, and thus it is possible to perform the processing with high in-plane uniformity.

Figure 3:
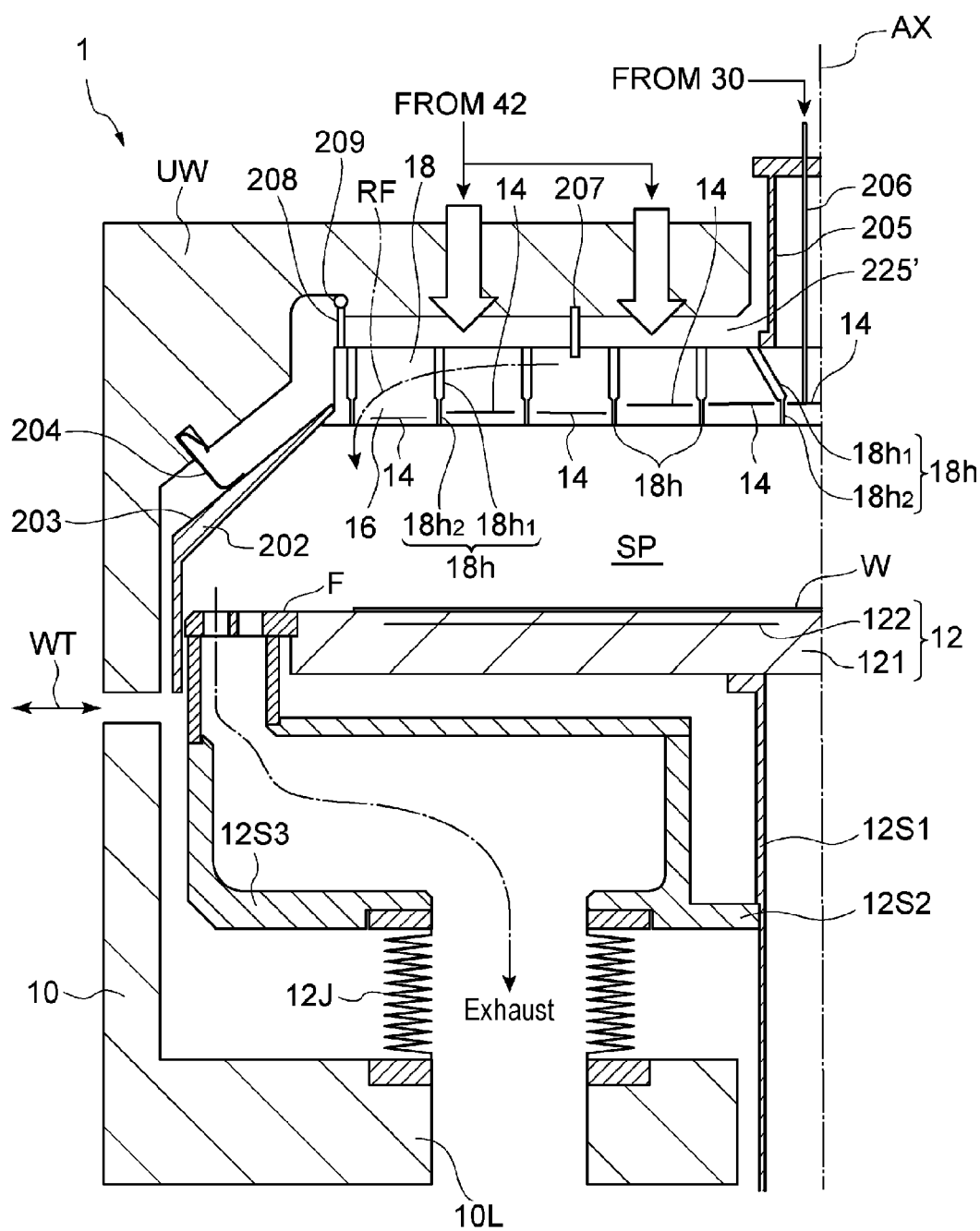
FIG. 3 is a view schematically illustrating a plasma processing apparatus according to another exemplary embodiment.

FIG. 3 is a view schematically illustrating a plasma processing apparatus according to another exemplary embodiment. Since the plasma processing apparatus is symmetrical with respect to the axis AX, only a half structure on the left-hand side is shown in FIG. 3. The structure not particularly described is the same as that of Example 1.

In this example, the gas diffusion space 225' is formed between the upper wall UW and the shower plate 18, and as in Example 1, the processing gas is supplied from the gas supply device 42 to in the gas diffusion space 225'. The supplied gas is ejected into the space SP for plasma generation via the gas ejection holes 18h in the shower plate 18 located below. In the gas ejection holes 18h located in a central portion of the shower plate 18, a longitudinal direction of the first through-holes 18h₁ in the upper portion is inclined from the vertical direction. The upper electrode 14 formed of a conductive thin film is embedded in the shower plate 18. The upper electrode 14 has a plurality of horizontal portions, each of which is annular in a plan view and extends in the horizontal direction. The plurality of horizontal portions is disposed concentrically, and positions thereof in the vertical direction (the thickness direction of the shower plate 18) are different from one another. The horizontal portions are connected to one another by vertical portions continuing thereto. The vertical portions are annular in a plan view and extend substantially in the vertical direction. A circular horizontal portion is arranged at the center of the upper electrode 14, and the upper electrode 14 is a single body as a whole and has a step-like vertical cross section as a whole. The upper electrode of this example has a mesh shape at least for the horizontal portions thereof, and positions corresponding to the through-holes for gas supply are open. A distance between the bottom surface of the upper dielectric as the main body of the shower plate 18 and the upper electrode 14 is smaller in the peripheral portion of the shower plate 18 than in the central portion of the shower plate 18. Thus, the same operative effect as described above is achieved, and the in-plane uniformity of plasma is improved. The upper electrode 14 is located at a lower position toward the peripheral portion thereof. A radio frequency voltage feeding rod 206 is connected to the upper electrode 14 at the center thereof, and a radio frequency power is supplied from the radio frequency power supply 30 via the feeding rod as in Example 1.

A support pipe 205 formed of an insulator such as aluminum nitride is disposed around the feeding rod 206. Radio frequency electromagnetic waves are generated from the feeding rod 206, and the radio frequency waves propagate in the radial direction between the bottom surface of the upper wall UW and the top surface of the upper electrode 14 like a waveguide passage RF and reach the inside of the plasma processing space SP from the introduction part 16 located in a peripheral region of the shower plate 18.

A cylindrical support wall 207 and a cylindrical partition wall 208 configured to hinder a gas flow are provided between the gas diffusion space 225' and the top surface of the shower plate 18 which is the upper dielectric. A seal 209 such as an elastic member (O-ring) having elasticity is disposed at an upper end of the partition wall 208, and a lower end of the partition wall 208 is in contact with the shower plate 18. A metal film 203 formed of aluminum or the like is provided on an outer surface of a dielectric inner wall 202. The metal film 203 is electrically connected to the inner wall (the inner surface of the upper wall UW) of the processing container via a spring 204 (an Inconel leaf spring) having an electrical contact with the metal film 203. The metal film 203 is grounded to the ground potential. One end of the spring 204 is fixed in a hole provided in the inner wall, and the other end of the spring 204 is in contact with the metal film 203. A thickness of the metal film 203 is 0.01 mm to 0.3 mm.

The plasma processing apparatus of this example includes the shower plate 18 (the upper dielectric), a stage main body 121 (a lower dielectric disposed to face the shower plate 18, and a lower electrode (conductive layer) 122 embedded in the stage main body 121. The plasma processing apparatus includes the processing container 10 accommodating therein the shower plate 18 and the stage 12.

The stage 12 is vertically movable by a support structure. The support structure includes a hollow support column 12S1 and a first support member 12S2 fixed to the support column 12S1 and having an annular shape in a plan view. The first support member 12S2 is provided with a second support member 12S3, which is formed integral with the first support member 12S2, so as to form an exhaust path, and the exhaust path is surrounded by a bellows structure 12J. A lower end of the bellows structure 12J is fixed to a lower wall 10L of the processing container, and an upper end of the bellows structure 12J is fixed to the first and second support members. When the support structure is moved vertically, the bellows structure 12J expands and contracts according to the vertical movement. A focus ring F formed of an insulator such as $Al_2O_3$ is disposed on an outer periphery of the stage 12, and a through-hole is formed in the focus ring F. The gas in the plasma processing space is exhausted to the outside via the through-hole and a region inside the bellows structure 12J. A bottom surface of the focus ring F is supported by a top surface of an outer peripheral portion of the stage.

Since there is a slight gap between the focus ring F and the dielectric inner wall 202, the gas in the plasma processing space is discharged to the outside via this gap regardless of the vertical movement of the stage. In addition, the dielectric inner wall 202 is engaging with and supported by a lip surface provided on an outer edge of the shower plate 18. In addition, an opening for loading and unloading the substrate W in a direction indicated by the arrow WT is formed in a side wall of the processing container 10.

Figure 4:
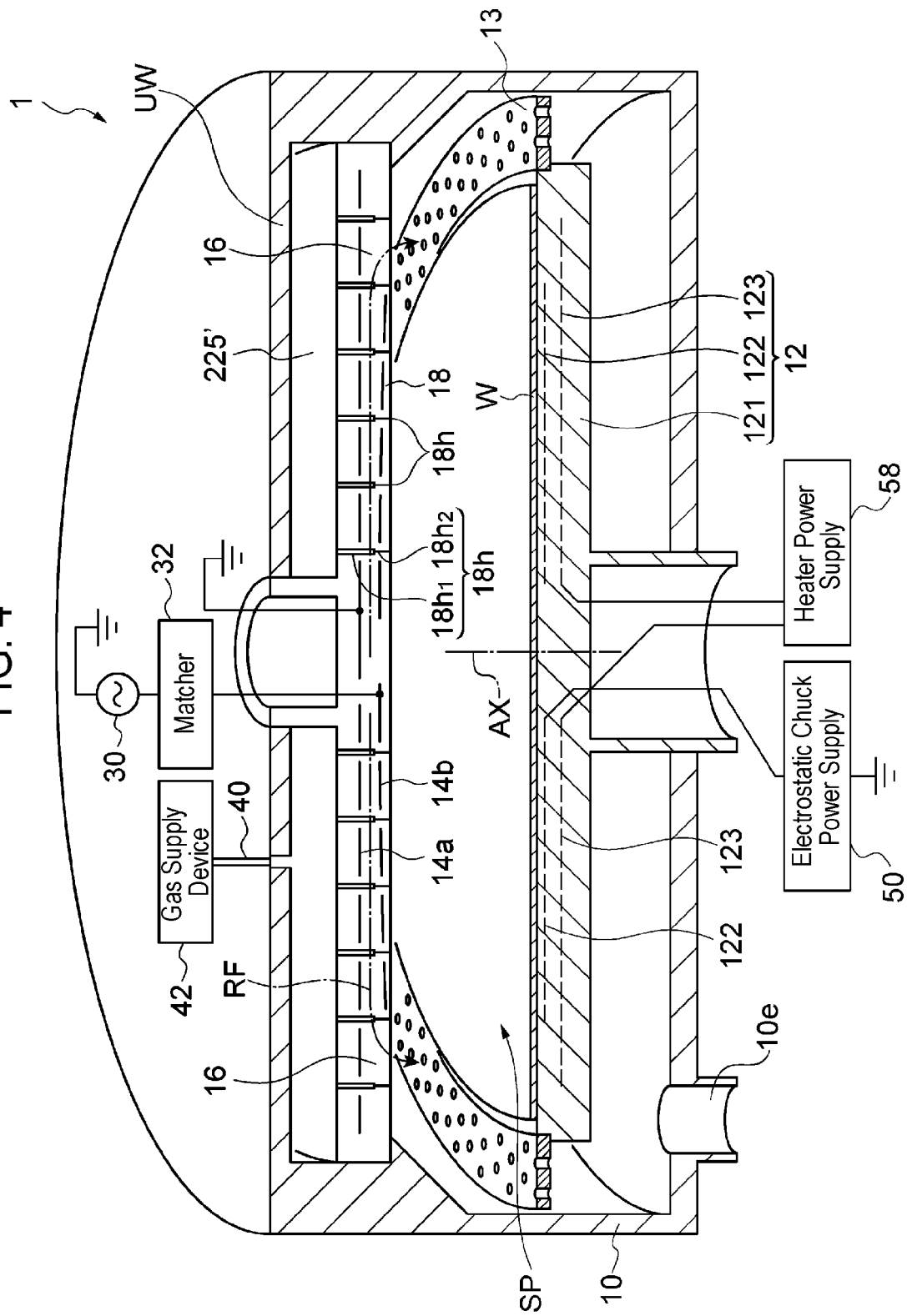
FIG. 4 is a view schematically illustrating a plasma processing apparatus according to an exemplary embodiment.

FIG. 4 is a view schematically illustrating a plasma processing apparatus according to an exemplary embodiment.

This plasma processing apparatus is different from the plasma processing apparatus illustrated in FIG. 1 in that two metal layers rather than one metal layer are embedded in the shower plate 18, and the other configurations are basically the same. Only the features different from those of the structure in FIG. 1 will be described.

The shower plate 18 includes an upper dielectric, which is formed of ceramic and has gas passage holes, as a main body thereof, and a plurality of conductive layers 14a and 14b is embedded in the upper dielectric. The number of conductive layers may be two or more. The upper conductive layer 14a is connected to the ground potential and is grounded. The lower conductive layer 14b is connected to the radio frequency power supply 30 via the matcher 32 as in the upper electrode 14 in FIG. 1.

A structure of each of the conductive layers 14a and 14b may have a mesh shape, but may be a metal thin film in which only regions where the gas supply through-holes (gas ejection holes) 18h are formed is open The conductive layer 14a is flat and has a vertical cross section extending in the horizontal direction. The conductive layer 14b as the upper electrode is provided so as to be inclined such that a distance between the bottom surface of the upper dielectric and the conductive layer 14b is smaller in the peripheral portion of the shower plate 18 than in the central portion of the shower plate 18. In addition, since the conductive layer 14 has a thin film shape or a mesh shape, even when a thermal expansion coefficient thereof is different from that of the dielectric, thermal stress at a high temperature is small. In addition, since the conductive layer 14b is covered with the dielectric, the conductive layer 14b is not corroded even at a high temperature. Radio frequency waves propagate in the radial direction between the conductive layer 14a and the conductive layer 14b, and are emitted from the introduction part 16 into the processing container 10. A radio frequency electric field is mainly applied between a bottom surface of the conductive layer 14b and the stage 12 and between a portion of a bottom surface of the conductive layer 14a, which does not overlapping with the conductive layer 14b, and the stage 12, and plasma is excited by this radio frequency electric field.

Figure 5:
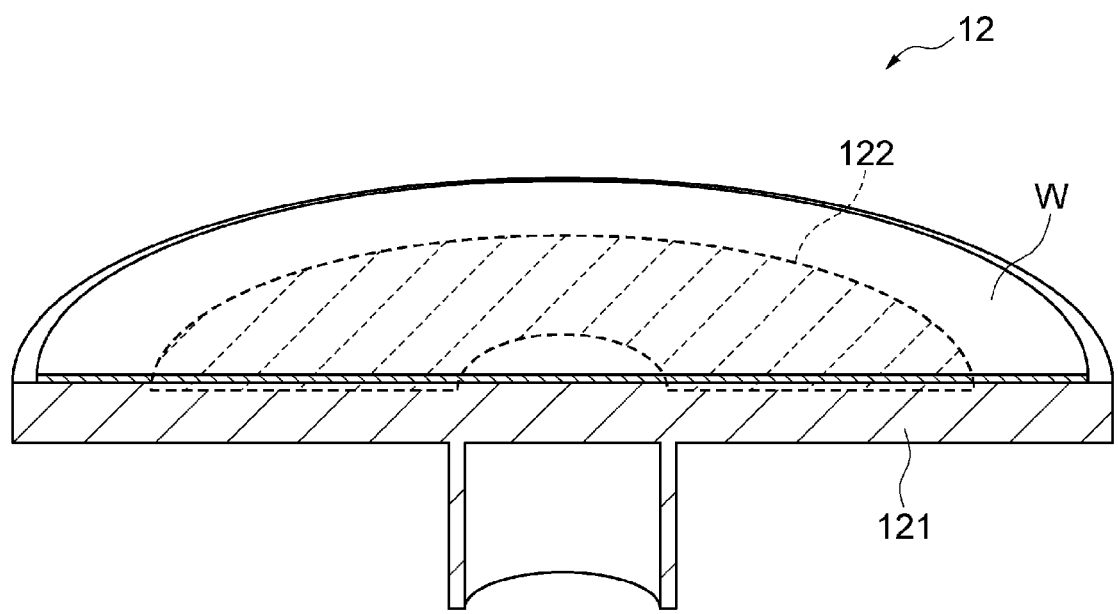
FIG. 5 is a partially exploded perspective view illustrating a stage according to an exemplary embodiment.

FIG. 5 is a partially exploded perspective view illustrating a stage according to an exemplary embodiment.

The stage 12 has the stage main body 121 and the conductive layer 122. The stage main body 121 is formed of a dielectric material (insulator) such as aluminum nitride. The stage main body 121 has a substantially disk-like shape. A central axis of the stage main body 121 substantially coincides with the axis AX illustrated in FIG. 1. The conductive layer 122 may have a mesh shape, but may also be a metal thin film provided with only necessary openings for passing a wiring or the like.

The conductive layer 122 is formed of a conductive material such as tungsten or molybdenum. The conductive layer 122 is provided inside the stage main body 121. The stage 12 may have one or more conductive layers. In this case, the conductive layer 122 has the shortest distance from a top surface of the stage 12 among the one or more conductive layers provided in the stage 12. The conductive layer 122 is formed in an annular shape around the axis AX illustrated in FIG. 1. An inner diameter (diameter) of the conductive layer 122 is, for example, ⅙ of a diameter of the substrate W, that is, 50 mm or more. An outer diameter of the conductive layer 122 is smaller than the diameter of the substrate W. In an embodiment, the conductive layer 122 may be formed in a mesh shape.

In an embodiment, the conductive layer 122 is an electrode for electrostatic attraction. In this embodiment, a DC power supply 50 is electrically connected to the conductive layer 122. When a DC voltage from the DC power supply 50 is applied to the conductive layer 122, an electrostatic attraction is generated between the stage 12 and the substrate W. The substrate W is attracted to the stage 12 by the generated electrostatic attraction, and is held by the stage 12. In another embodiment, the conductive layer 122 may be a radio frequency electrode. In this case, a radio frequency power supply is electrically connected to the conductive layer 122 via a matcher. In still another embodiment, the conductive layer 122 may be an electrode that is grounded.

In the plasma processing apparatus 1 described above, the conductive layer 122 is formed in an annular shape. Therefore, generation of a potential difference due to radio frequency waves between the central portion and the outer peripheral portion of the stage 12 is suppressed. As a result, generation of a radio frequency electric field between the central portion and the outer peripheral portion of the stage 12 is suppressed.

Figure 6:
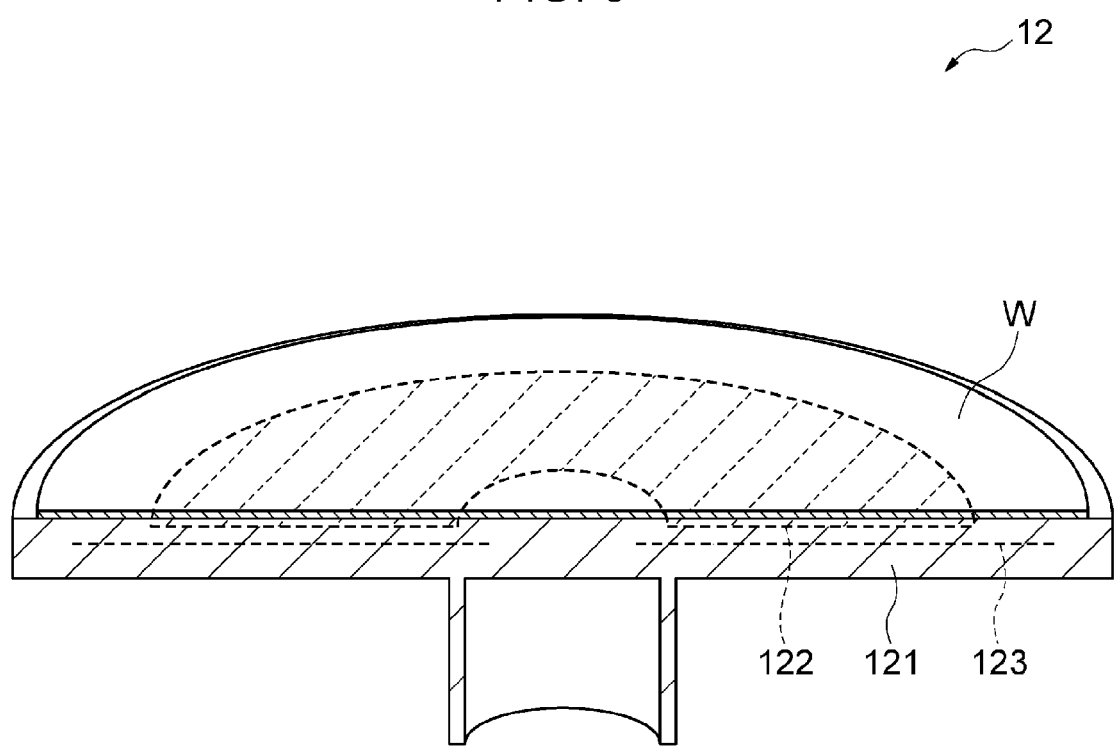
FIG. 6 is a partially exploded perspective view illustrating a stage according to an exemplary embodiment.

FIG. 6 is a partially exploded perspective view illustrating a stage according to an exemplary embodiment.

The stage 12 has the stage main body 121 and the conductive layer 122 like the above-mentioned stage 12. The conductive layer 122 of the stage 12 is an electrode for electrostatic attraction. The DC power supply 50 is electrically connected to the conductive layer 122.

The stage 12 further includes a conductive layer 123. A distance between the conductive layer 123 and the top surface of the stage 12 is larger than the distance between the conductive layer 122 and the top surface of the stage 12. That is, the conductive layer 122 has the shortest distance from the top surface of the stage 12 among the plurality of conductive layers of the stage 12.

In an embodiment, the conductive layer 123 is a heater (a resistive heating element). In this embodiment, the conductive layer 123 is electrically connected to a heater power supply 58 via a common mode filter. The conductive layer 123 is formed in an annular region in the stage main body 121. A central axis of this annular region substantially coincides with the axis AX. An inner diameter of this annular region is, for example, ⅙ of the diameter of the substrate W, that is, 50 mm or more. An outer diameter of this annular region is smaller than the diameter of the substrate W. The conductive layer 123 may be formed in a mesh shape.

Figure 7:
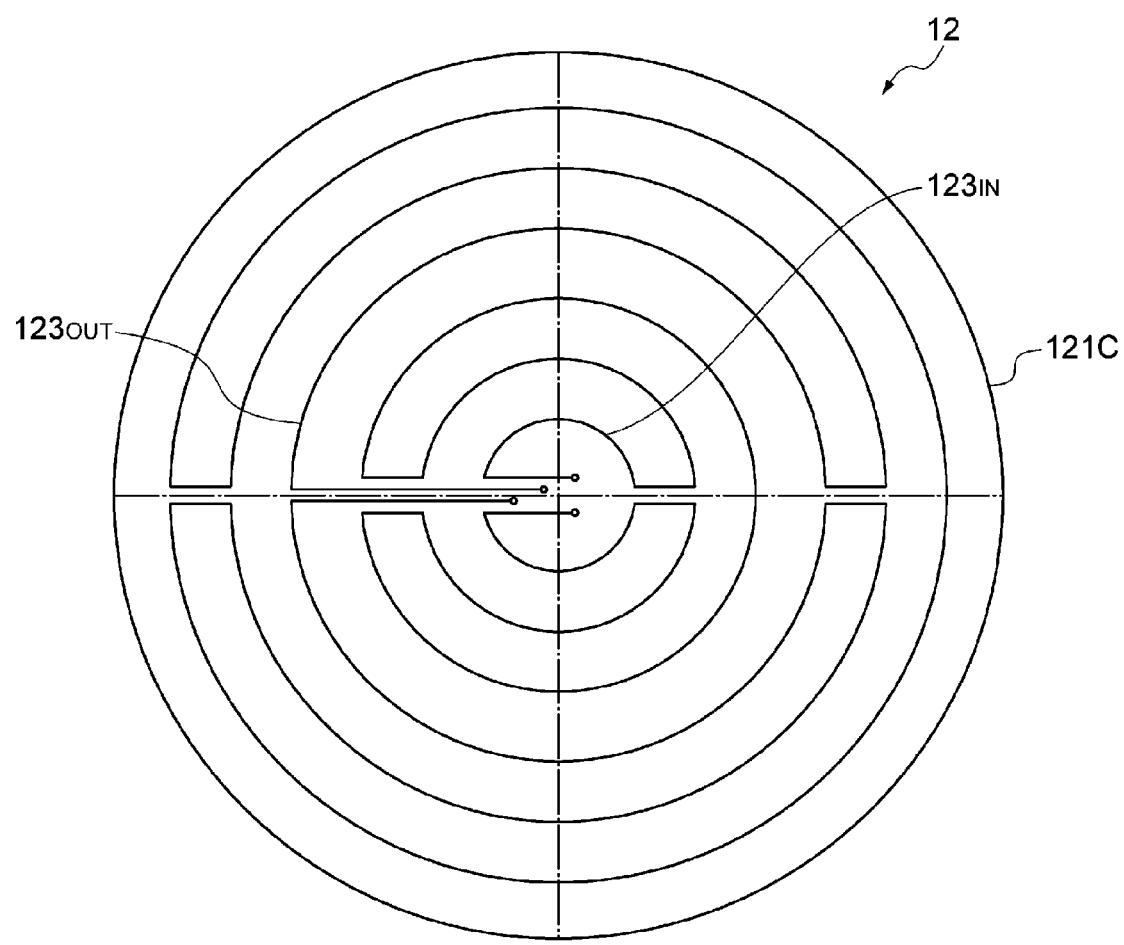
FIG. 7 is a plan view illustrating a stage according to an exemplary embodiment.

FIG. 7 is a plan view illustrating a stage according to an exemplary embodiment.

In this example, the heater composed of the conductive layer 123 is divided into two regions. The stage 12 includes the stage main body 121 and the conductive layer 123 embedded in the body 121. The conductive layer 123 includes an inner conductive layer $123_{IN}$, which is present in a central region of the stage, and an outer conductive layer $123_{OUT}$, which is present in a peripheral region of the stage. The heater is formed of a material having a volume resistivity higher than that of Cu, Al, or the like, and a resistance value thereof depends on a cross-sectional area and length of a path through which a current flows. Each of the above-mentioned conductive layers may be formed in an annular shape, but in this example, conductive layers having a linear shape in a plan view are bent and arranged, as illustrated in FIG. 7. The inner conductive layer $123_{IN}$ heats the central region of the stage 12, and the outer conductive layer $123_{OUT}$ heats the peripheral region of the stage 12.

In other words, in this example, a plurality of heating regions is set in different regions in the radial direction of the stage 12. An inner heater (the inner conductive layer $123_{IN}$) and an outer heater (the outer conductive layer $123_{OUT}$) may be electrically coupled to each other, but in this example, a common mode filter may be interposed between each heater and each heater power supply. The common mode filter has a high common mode impedance at a plasma excitation frequency. With this configuration, electrical coupling between the heaters may be weakened. As a result, it is possible to suppress the electrical coupling between the heaters and plasma in the outer peripheral portion and the central portion of the stage.

As described above, by using electrodes embedded in dielectrics in upper and lower portions, it is possible to make an electric field on surfaces of the electrodes uniform and to make a plasma distribution uniform. In addition, since a conductive mesh electrode is embedded in the dielectric, the conductive mesh electrode is not exposed to a corrosive gas, and thus a function thereof can be maintained even when the conductive mesh electrode is used in a process chamber.

Although various exemplary embodiments have been described above, the present disclosure is not limited to the exemplary embodiments described above, and various omissions, substitutions, and changes may be made. In addition, elements in different embodiments may be combined to form other embodiments. From the foregoing description, it should be understood that various embodiments of the present disclosure have been described herein for purposes of illustration, and that various modifications can be made without departing from the scope and spirit of the present disclosure. Accordingly, the various embodiments disclosed herein are not intended to be limiting, and the true scope and spirit of the disclosure is indicated by the appended claims.

EXPLANATION OF REFERENCE NUMERALS

1: plasma processing apparatus, 10: processing container, 10L: lower wall, 10e: exhaust port, 12: stage, 12J: bellows structure, 12S1: support column, 12S2: first support member, 12S3: second support member, 13: baffle member, 14: upper electrode, 16: introduction part, 18: shower plate, 18h: gas ejection hole, 30: radio frequency power supply, 32: matcher, 40: pipe, 42: gas supply device, 50: DC power supply, 58: heater power supply, 122: conductive layer (lower electrode), 123: conductive layer, F: focus ring, 202: dielectric inner wall, 203: metal film, 204: spring, 205: support pipe, 206: feeding rod, 207: support wall, 208: partition wall, 209: seal, RF: waveguide passage, SP: space, UW: upper wall, W: substrate

What is claimed is:

1. A shower plate comprising:
an upper dielectric disposed to face a stage;
a first conductive layer embedded in the upper dielectric and connected to a ground potential; and
a second conductive layer, as an upper electrode, embedded in the upper dielectric, disposed below the first conductive layer, and connected to a radio frequency power supply,
wherein a distance between a bottom surface of the upper dielectric and the second conductive layer is shorter in a peripheral portion of the shower plate than in a central portion of the shower plate, and
wherein radio frequency waves propagate in the upper dielectric between the first conductive layer and the second conductive layer.

2. The shower plate of claim 1, wherein the upper dielectric includes gas ejection holes.

3. The shower plate of claim 2, wherein a radio frequency voltage of 30 to 300 MHz is applied to the upper electrode.

4. The shower plate of claim 1, wherein the upper dielectric includes gas ejection holes.

5. The shower plate of claim 1, wherein a radio frequency voltage of 30 to 300 MHz is applied to the upper electrode.

6. A plasma processing apparatus comprising a shower plate that comprises an upper dielectric disposed to face a stage, a first conductive layer embedded in the upper dielectric and connected to a ground potential, and a second conductive layer, as an upper electrode, embedded in the upper dielectric, disposed below the first conductive layer, and connected to a radio frequency power supply,
wherein a distance between a bottom surface of the upper dielectric and the second conductive layer is shorter in a peripheral portion of the shower plate than in a central portion of the shower plate,
wherein radio frequency waves propagate in the upper dielectric between the first conductive layer and the second conductive layer, and
wherein the stage includes:
   a lower dielectric disposed to face the upper dielectric; and
   a lower electrode embedded in the lower dielectric, and
wherein the plasma processing apparatus further includes:
   a processing container configured to accommodate the shower plate and the stage; and
   the radio frequency power supply configured to generate plasma in the processing container.

7. The plasma processing apparatus of claim 6, wherein the upper dielectric includes gas ejection holes.

8. The plasma processing apparatus of claim 7, wherein a radio frequency voltage of 30 to 300 MHz is applied to the upper electrode.

9. The plasma processing apparatus of claim 6, wherein the upper dielectric includes gas ejection holes.

10. The plasma processing apparatus of claim 6, wherein a radio frequency voltage of 30 to 300 MHz is applied to the upper electrode.

11. The plasma processing apparatus of claim 6, wherein the lower electrode is any of an electrode configured to generate electrostatic attraction between a substrate placed on the stage and the stage, an electrode to which radio frequency waves are supplied, and a grounded electrode, and is formed in an annular shape.

12. A plasma processing method using the plasma processing apparatus in claim 6, the method comprising:
   placing a substrate below the shower plate; and
   generating plasma by applying a radio frequency voltage between the upper electrode and the lower electrode so as to perform a surface processing of the substrate.

* * * * *